United States Patent
Yamada et al.

(10) Patent No.: US 8,153,511 B2
(45) Date of Patent: Apr. 10, 2012

(54) METHOD FOR MANUFACTURING SEMICONDUCTOR DEVICE

(75) Inventors: Daiki Yamada, Kanagawa (JP); Naoto Kusumoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 49 days.

(21) Appl. No.: 11/420,889

(22) Filed: May 30, 2006

(65) Prior Publication Data

US 2006/0270195 A1 Nov. 30, 2006

(30) Foreign Application Priority Data

May 30, 2005 (JP) .................................. 2005-156583

(51) Int. Cl.
*H01L 21/00* (2006.01)
(52) U.S. Cl. ................ 438/463; 438/458; 257/E21.483; 257/E21.517
(58) Field of Classification Search .................. 438/463, 438/458; 257/E21.483, E21.517
See application file for complete search history.

(56) References Cited

U.S. PATENT DOCUMENTS

| | | | |
|---|---|---|---|
| 4,312,680 A | 1/1982 | Hsu | |
| 5,435,953 A * | 7/1995 | Osada et al. | 264/102 |
| 5,877,034 A * | 3/1999 | Ramm et al. | 438/15 |
| 6,358,767 B2 | 3/2002 | Eguchi | |
| 6,856,360 B1 | 2/2005 | Higuchi et al. | |
| 6,922,890 B2 * | 8/2005 | Dai et al. | 29/841 |
| 7,012,008 B1 | 3/2006 | Shields et al. | |
| 7,323,368 B2 | 1/2008 | Takayama et al. | |
| 7,403,238 B2 | 7/2008 | Higuchi et al. | |
| 7,608,492 B2 | 10/2009 | Takayama et al. | |
| 7,858,901 B2 | 12/2010 | Krishnan et al. | |
| 2002/0113549 A1* | 8/2002 | Yamazaki et al. | 313/506 |
| 2002/0119606 A1* | 8/2002 | Hamada et al. | 438/149 |
| 2004/0239827 A1* | 12/2004 | Yamazaki et al. | 349/45 |
| 2005/0045090 A1 | 3/2005 | Ikegami et al. | |
| 2005/0136622 A1* | 6/2005 | Mulligan et al. | 438/460 |
| 2005/0285231 A1 | 12/2005 | Arao et al. | |
| 2006/0011288 A1 | 1/2006 | Watanabe et al. | |
| 2006/0068567 A1* | 3/2006 | Beyne et al. | 438/460 |
| 2006/0084241 A1* | 4/2006 | Chin et al. | 438/460 |
| 2006/0189099 A1* | 8/2006 | Lu et al. | 438/460 |
| 2006/0197088 A1 | 9/2006 | Isobe et al. | |
| 2008/0042168 A1 | 2/2008 | Watanabe et al. | |

(Continued)

FOREIGN PATENT DOCUMENTS

EP 0 038 133 A1 10/1981

(Continued)

*Primary Examiner* — Julia Slutsker
(74) *Attorney, Agent, or Firm* — Fish & Richardson P.C.

(57) ABSTRACT

It is an object to improve a yield of a step of cutting off a substrate. A substrate is cut off by using an ablation process. An ablation process uses a phenomenon in which a molecular bond in a portion irradiated with a laser beam, that is, a portion which absorbs the laser beam is cut off, photodegraded, and evaporated. In other words, a substrate is irradiated with a laser beam, a molecular bond in a portion of the substrate is cut off, photodegraded, and evaporated; accordingly, a groove is formed in the substrate. A method for cutting the substrate has steps of selectively emitting a laser beam and forming a groove in the substrate, and selectively emitting a laser beam to the groove and cutting off the substrate. Methods for manufacturing a groove in a substrate and cutting off a substrate are used for manufacturing a semiconductor device.

32 Claims, 11 Drawing Sheets

U.S. PATENT DOCUMENTS

| | | |
|---|---|---|
| 2008/0044940 A1 | 2/2008 | Watanabe et al. |
| 2008/0121906 A1 * | 5/2008 | Yakushiji ..................... 257/94 |
| 2009/0212297 A1 | 8/2009 | Watanabe et al. |

FOREIGN PATENT DOCUMENTS

| | | |
|---|---|---|
| JP | 56-152272 A | 11/1981 |
| JP | 9216085 A | 8/1997 |
| JP | 11160735 A | 6/1999 |
| JP | 2001035816 A | 2/2001 |
| JP | 2001-064029 | 3/2001 |
| JP | 2003066424 A | 3/2003 |
| JP | 2004-507072 A | 3/2004 |
| JP | 2004-119406 A | 4/2004 |
| JP | 2004268104 A | 9/2004 |
| JP | 2005074485 A | 3/2005 |
| JP | 2006-287205 A | 10/2006 |
| WO | 01/71803 A1 | 9/2001 |
| WO | 2004105995 A1 | 12/2004 |
| WO | 2006/123825 | 11/2006 |

* cited by examiner

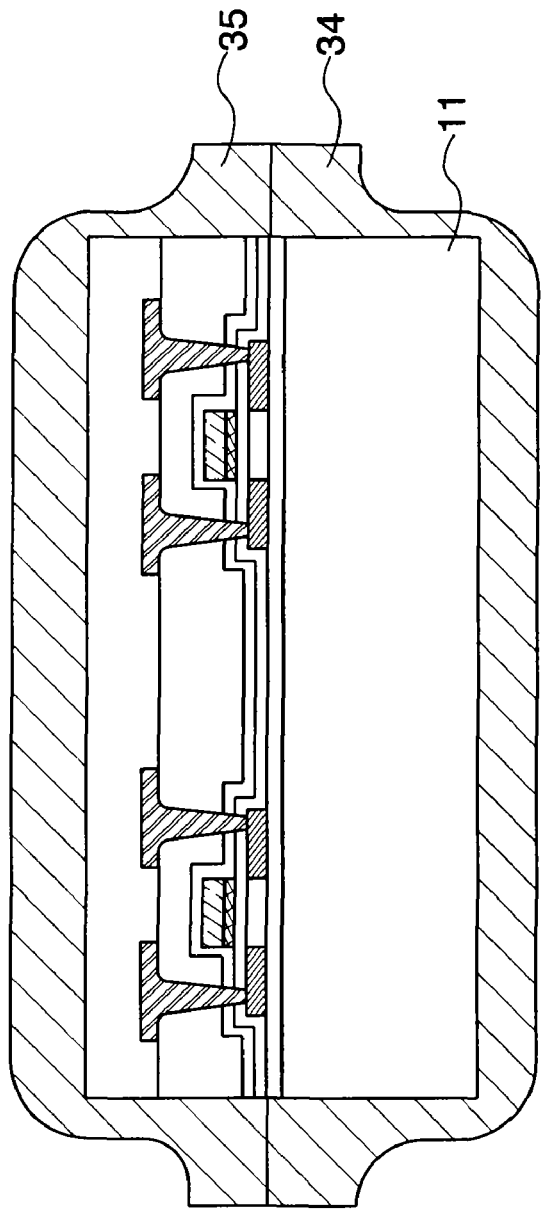
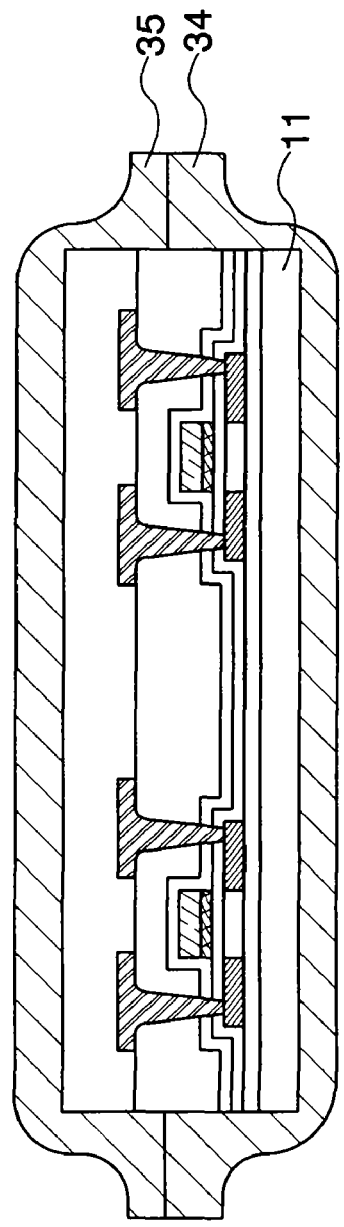
FIG.4A
FIG.4B

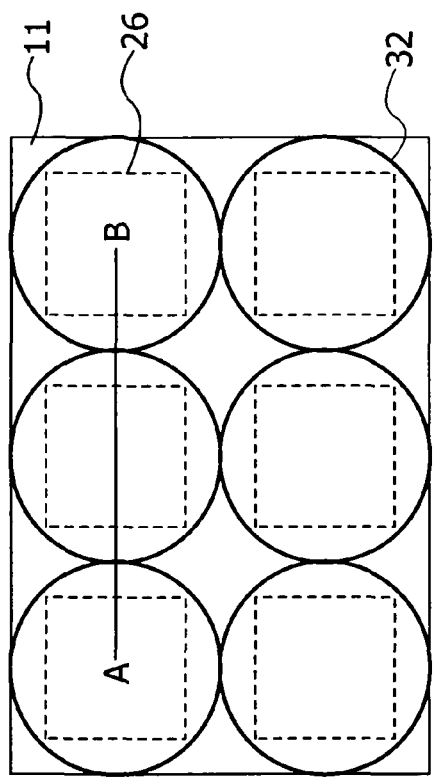
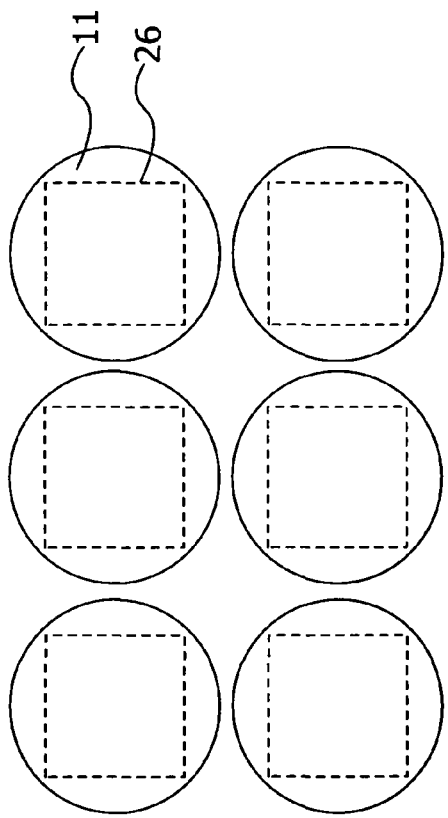
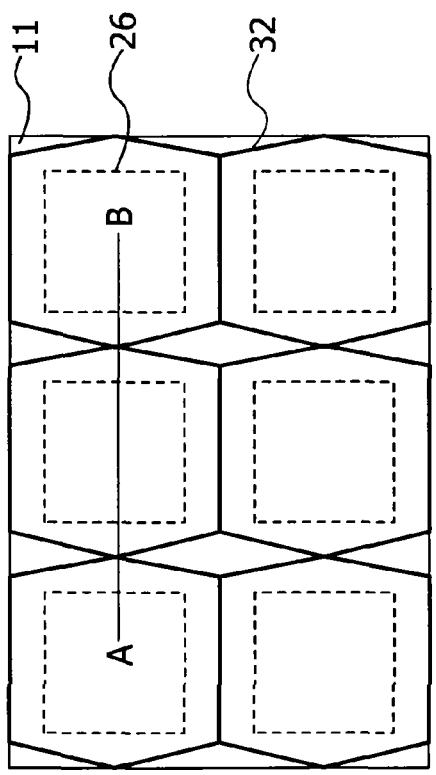
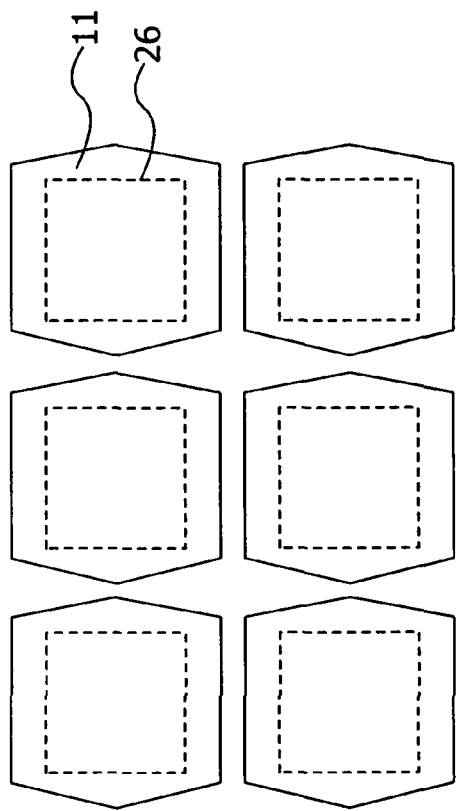

METHOD FOR MANUFACTURING SEMICONDUCTOR DEVICE

BACKGROUND OF THE INVENTION

1. Field of the Invention

The present invention relates to a method for manufacturing a groove of a substrate and a method for cutting off a substrate. In addition, the present invention relates to a method for manufacturing a semiconductor device. The semiconductor device corresponds to a device including a transistor.

2. Description of the Related Art

In recent years, development of a semiconductor device including a transistor has been advanced. A semiconductor device is formed by forming a transistor over a substrate, and then cutting off the substrate.

In many cases, a substrate is cut off as follows. First, a groove (also referred to as a scribe line) is formed at the surface of the substrate by using a scribing device. Then, the substrate is forcibly cut off along the groove by using a cutting device. In addition, a substrate is cut off by using a laser beam (hereinafter, a laser beam is included in laser light) as follows. First, the substrate is selectively irradiated with a laser beam to locally heat the substrate. Then, the surface of the substrate which is heated is locally cooled by a cooling medium. Subsequently, a crack is formed by utilizing thermal stress which is generated in the substrate, and accordingly, the substrate is cut off (for example, see Patent Document 1)

[Patent Document 1] Japanese Patent Laid-Open No. 2001-64029

When a substrate is cut off by using a scribing device, there is a case where a groove is not formed in a desired shape due to a layer which is provided over the surface of the substrate. As a result, the substrate cannot be cut off in a desired shape, which results in reduction in a yield. In addition, the substrate is cut off by using press power; therefore, a crack is easily generated from the groove and the cutting surface is adversely affected (see a photograph showing a cutting surface of a glass substrate of FIG. 6D). Also, a burr may arise when that the substrate is plastic. "Burr" is called a state that a corner of the substrate is unprocessed smoothly. The state is often beard-form. As described above, cutting off a substrate by using a scribing device has been a factor of generating an exterior problem of a cutting surface and reducing a yield. In addition, it has been difficult to form a scribe line in a polygonal shape or a rounded shape in cutting off a substrate by using a scribing device.

In addition, a cutter is used for a scribing device, and such a cutter becomes worn after using multiple times; therefore, it is necessary that the cutter is replaced. Since a cutter is expensive, it has been difficult to reduce manufacturing cost in using a cutter.

Moreover, when a substrate is cut off by using a laser beam, there are cases where the substrate is transformed due to heating and a crack is generated in the substrate due to stress which remains inside the substrate.

SUMMARY OF THE INVENTION

The present invention is made in view of the above problems. It is an object of the resent invention to provide a method for manufacturing a groove of a substrate, a method for cutting off a substrate, and a method for manufacturing a semiconductor device, each of which can improve a yield.

A method for manufacturing a groove of a substrate of the present invention includes steps of selectively emitting a laser beam to form the groove in the substrate. One feature of the present invention is that an ablation process is used. The ablation process utilizes a phenomenon in which a molecular bond in a portion irradiated with a laser beam, that is, the portion absorbing the laser beam is cut off, photodegraded, and evaporated is used. In other words, the method for manufacturing a groove of a substrate of the present invention is as follows. A substrate is irradiated with a laser beam, and then a molecular bond in a portion of the substrate is cut off, photodegraded, and evaporated; accordingly, the groove is formed.

A method for manufacturing a groove of a substrate of the present invention includes steps of selectively emitting a laser beam to form the groove in the substrate and selectively emitting a laser beam to the groove to cut off the substrate. An ablation process is used in the present invention, and a substrate is irradiated with a laser beam, a molecular bond in a portion of the substrate is cut off, photodegraded, and evaporated; accordingly, the substrate is cut off.

In addition, in the present invention, a substrate may be thinned by performing one or both of grinding and polishing to the substrate by using one or both of a grinding device and a polishing device. More specifically, the substrate may be thinned to be 100 μm or less by using one or both of the grinding device and the polishing device. By thinning the substrate, formation of a groove in the substrate and cutting off the substrate can be performed easily at short times.

According to one feature of the present invention, a method for manufacturing a semiconductor device uses the above method for manufacturing a groove of a substrate and the above method for cutting off a substrate. The method for manufacturing a semiconductor device of the present invention includes steps of forming a layer including a transistor over a substrate; forming a first insulating layer over the layer including the transistor; forming a conductive layer which is connected to a source region or a drain region of the transistor through an opening provided in the first insulating layer; forming a second insulating layer which covers the conductive layer; and cutting off the first insulating layer, the insulating layer which is provided in the layer including the transistor, the second insulating layer, and the substrate by selectively emitting a laser beam.

A method for manufacturing a semiconductor device of the present invention includes steps of forming a layer including a transistor over a substrate; forming a first insulating layer over the layer including the transistor; forming a conductive layer which is connected to a source region or a drain region of the transistor through an opening provided in the first insulating layer; forming a second insulating layer which covers the conductive layer; forming a groove in one or more of the first insulating layer, the insulating layer which is provided in the layer including the transistor, the second insulating layer, and the substrate by selectively emitting a laser beam; and cutting off the first insulating layer, the insulating layer which is provided in the layer including the transistor, the second insulating layer, and the substrate by selectively emitting a laser beam.

A method for manufacturing a semiconductor device of the present invention includes steps of forming a layer including a transistor over one of surfaces of a substrate; forming a first insulating layer over the layer including the transistor; forming a conductive layer which is connected to a source region or a drain region of the transistor through an opening provided in the first insulating layer; forming a second insulating layer which covers the conductive layer; polishing the other surface of the substrate; and cutting off the first insulating layer, the insulating layer which is provided in the layer including the transistor, the second insulating layer, and the substrate by selectively emitting a laser beam.

Note that a solid laser which can oscillate a laser beam having a wavelength of 1 to 380 nm which is a visible light region may be used for a laser. More preferably, an Nd:YVO$_4$ laser having a wavelength of an ultraviolet region may be used. It is because compared with other laser beams at a longer wavelength side, the Nd:YVO$_4$ laser beam having a wavelength of an ultraviolet region is more easily absorbed in a substrate and an ablation process can be performed.

Note that a glass substrate may be used for a substrate. It is because a glass substrate easily absorbs a laser beam of an ultraviolet region, and therefore, an ablation process is easily performed.

A method for cutting off the substrate or forming the groove in the substrate in the present invention can be applied to methods of fabricating a liquid crystal display device and an EL (OLED) display device or the like. Moreover, a method of cutting off the substrate or forming the groove in the substrate in the present invention can be applied to not only an active matrix type display device but also a passive matrix type display device. Note that the liquid crystal and the EL (OLED) display devices and the active matrix type and passive matrix type display devices also have insulating layers.

The present invention uses an ablation process; accordingly, forming a groove in an insulating layer which is provided in a substrate and over the substrate and cutting off the insulating layer which is provided in the substrate and over the substrate can be performed easily at short times, and a yield can be improved. Moreover, the present invention uses a laser beam; therefore, a process of such a desired shape as not only a simple square shape but also a polygonal shape or a rounded shape can be easily performed.

BRIEF DESCRIPTION OF THE DRAWINGS

In the accompanying drawings:

FIGS. 4A and 4B are views each explaining a semiconductor device of the present invention;

FIGS. 5A to 5D are views each explaining a semiconductor device of the present invention;

DETAILED DESCRIPTION OF THE INVENTION

Figure 1A:
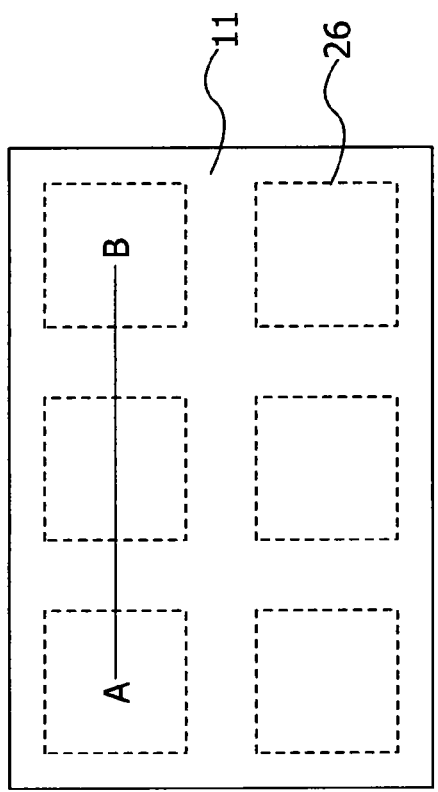
FIGS. 1A and 1B are views each explaining a semiconductor device of the present invention.

Best Mode for Carrying Out the Invention

Embodiment Mode of the present invention will be explained in detail using the accompanying drawings. However, the present invention is not limited to the description below, and it is easily understood by those skilled in the art that modes and details thereof can be modified in various ways without departing from the purpose and the scope of the present invention. Therefore, the present invention is not understood as being limited to the description in Embodiment Mode. Note that in the structure of the present invention which is hereinafter described, the reference numerals denoting the same portions are used in common in different drawings.

Figure 1B:
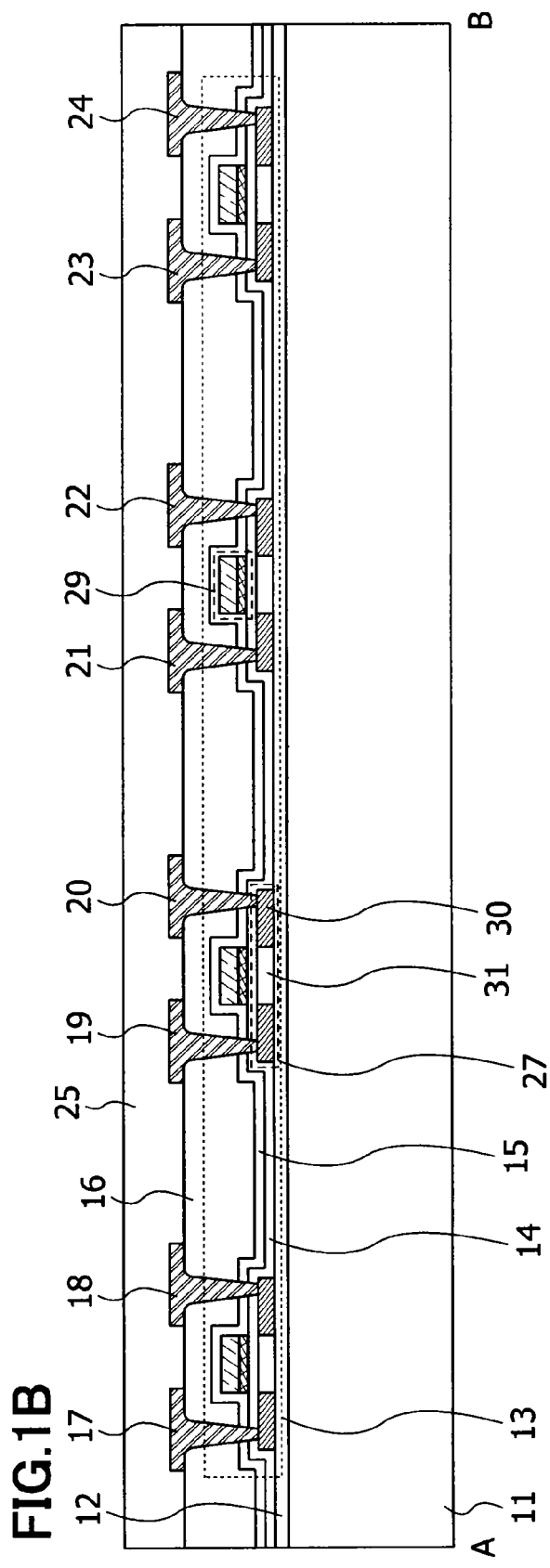

A method for manufacturing a semiconductor device of the present invention will be explained with reference to FIGS. 1A and 1B, FIGS. 2A and 2B, FIGS. 3A and 3B, FIGS. 4A and 4B, FIGS. 5A to 5D, and FIGS. 6A to 6D. Note that a case where six thin film integrated circuits are manufactured over a substrate 11 will be explained hereinafter. Further, a region where one thin film integrated circuit is provided in each of FIG. 1A, FIG. 2A, and FIG. 3A corresponds to a region 26 surrounded by a dashed line. FIG. 1B, FIG. 2B, and FIG. 3B correspond to cross-sectional views of point A to point B of FIG. 1A, FIG. 2A, and FIG. 3A, respectively.

First, an insulating layer 12 is formed over one of the surfaces of the substrate 11 (see FIG. 1B). Next, a layer including a plurality of transistors 13 is formed over the insulating layer 12, and then, insulating layers 15 and 16 are formed over the layer including the plurality of transistors 13. Next, conductive layers 17 to 24 are formed, each of which is connected to a source region or a drain region of each of the plurality of transistors 13 through openings provided in the insulating layers 15 and 16. Subsequently, an insulating layer 25 is formed so as to cover the conductive layers 17 to 24.

The substrate 11 corresponds to a glass substrate, a plastic substrate, a silicon substrate, a quartz substrate, and the like. A glass substrate or a plastic substrate is preferably used as the substrate 11. A glass substrate or a plastic substrate having 1 meter or longer on a side is easily manufactured, and a desired shaped glass substrate or plastic substrate is also easily manufactured. Therefore, when a large-sized square glass substrate or plastic substrate having 1 meter or longer on a side is used, for example, productivity can be considerably improved. Such merits are great advantages as compared with a case of using a circular silicon substrate.

The insulating layer 12 functions to prevent intrusion of an impurity from the substrate 11. The insulating layer 12 is formed by a single layer or a stacked layer of a layer containing oxide of silicon or nitride of silicon by a sputtering method, a plasma CVD method, or the like. A material for the oxide of silicon is a substance containing silicon (Si) and oxygen (O), and silicon oxide, silicon oxide containing nitrogen, or the like corresponds thereto. A material for the nitride of silicon is a substance containing silicon and nitrogen (N), and silicon nitride, silicon nitride containing oxygen, or the like corresponds thereto. Note that the insulating layer 12 may not necessarily be formed when it is not necessary to be formed.

Each of the plurality of transistors 13 has a semiconductor layer 27, an insulating layer 14, and a conductive layer 29 which is a gate electrode. The semiconductor layer 27 has an impurity region 30 functioning as a source region or a drain region, and a channel formation region 31. An impurity element imparting N-type or P-type is added to the impurity region 30. Specifically, an impurity element imparting N-type (an element belonging to Group 15 of the periodic table, for example phosphorus (P) or arsenic (As)) or an impurity element imparting P-type (for example boron (B)) is added. The insulating layer 14 corresponds to a gate insulating layer.

Note that although only the plurality of transistors 13 are formed in the structure shown in the drawing, the present invention is not limited thereto. An element which is provided over the substrate 11 may be appropriately adjusted in accordance with an application of the semiconductor device. In a case of forming a semiconductor device having a function to transmit and receive electromagnetic waves, for example, only a plurality of transistors may be formed, or alternatively, a plurality of transistors and a conductive layer functioning as an antenna may be formed over the substrate 11. Note that the conductive layer functioning as an antenna may not necessarily be formed by one layer but a multilayer. In addition, in a case of forming a semiconductor device having a function to store data, a plurality of transistors and a memory element (such as a transistor or a memory transistor) may also be formed over the substrate 11. Also, in a case of forming a semiconductor device (such as a CPU or a signal generating circuit) having a function to control a circuit, generate a signal, or the like, a transistor may be formed over the substrate 11. Moreover, other elements such as a resistor element and a capacitor element may be formed in addition to the above elements, if necessary. Note that in a case of forming a semiconductor device having a function to transmit and receive electromagnetic waves, only a plurality of transistors may be formed over the substrate 11.

The insulating layers 15 and 16 are formed by a single layer or a stacked layer by an inorganic material or an organic material by using an SOG (spin on glass) method, a droplet discharging method, a screen printing method, or the like. For example, nitride of silicon containing oxygen may be formed as the insulating layer 15, and oxide of silicon containing nitrogen may be formed as the insulating layer 16.

Figure 2A:
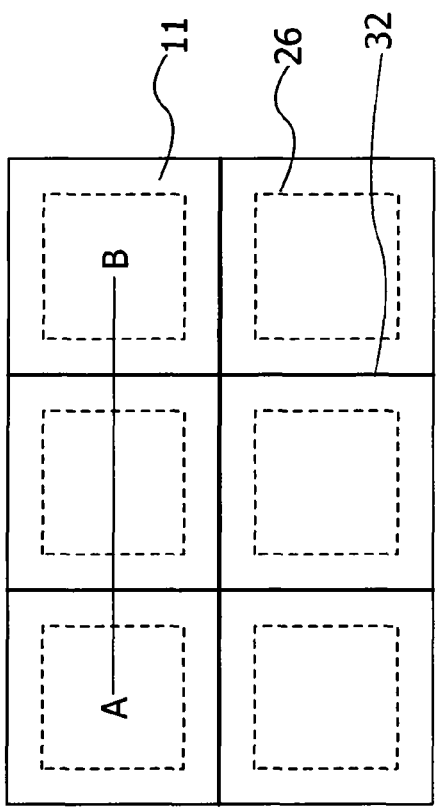
FIGS. 2A and 2B are views each explaining a semiconductor device of the present invention.
Figure 2B:
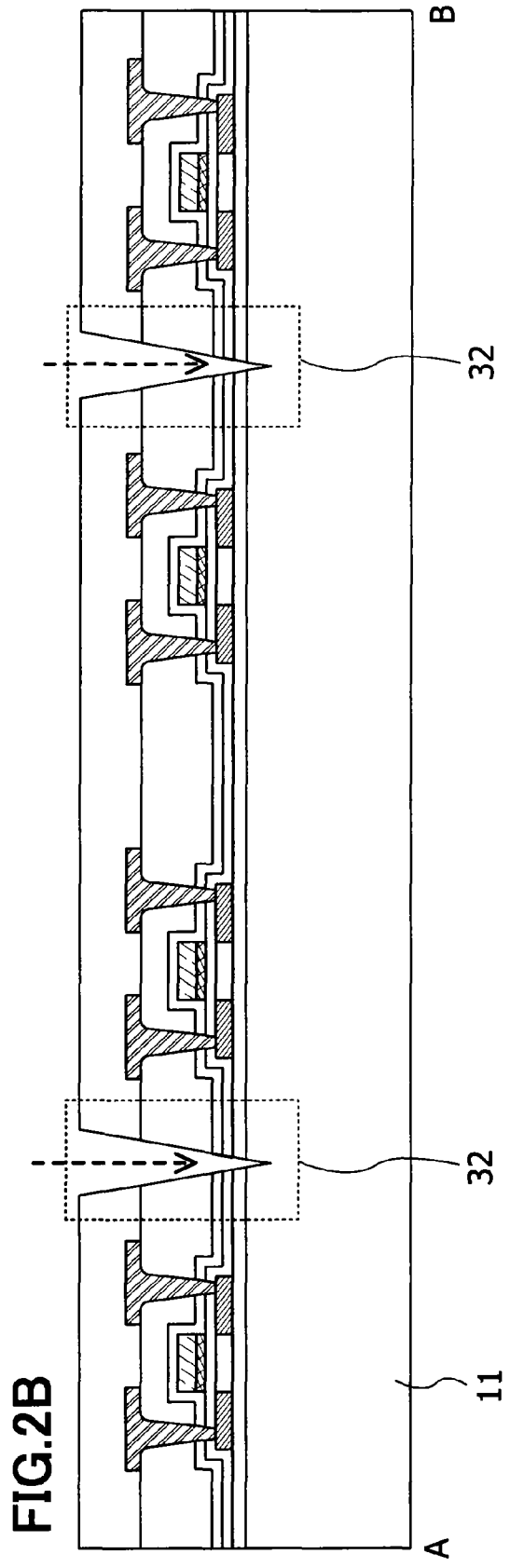

Next, a laser beam is selectively emitted, that is, to a predetermined position, and grooves 32 are formed in one or more of the insulating layers 14, 15, 16, and 25 that are provided in the layer including the substrate 11, the insulating layer 12, and the plurality of transistors 13 (see FIGS. 2A and 2B). In the structure shown in the drawing, the insulating layers 12, 14, 15, and 16 are cut off by a laser beam, and the grooves 32 are formed in the substrate 11.

A laser medium, an excitation source, and a resonator are included in a laser. Any type of laser may be used in the present invention although a laser is classified into a gas laser, a liquid laser, and a solid laser according to a medium, and classified into a free electron laser, a semiconductor layer, and an X-ray laser according to the type of oscillation. Note that a gas laser or a solid laser is preferably used, and a solid laser is more preferably used.

A gas laser includes a helium-neon laser, a carbon dioxide laser, an excimer laser, and an argon ion laser. An excimer laser includes a rare gas excimer laser and a rare gas halide excimer laser. A rare gas excimer laser oscillates by three kinds of excite molecules: argon, krypton, and xenon. An argon iron laser includes a rare gas ion laser and a metal vapor ion laser.

A liquid laser includes an inorganic liquid laser, an organic chelate laser, and a pigment laser. In an inorganic liquid laser and an organic chelate laser, rare earth ions such as neodymium, which are utilized for a solid laser, are used as a laser medium.

A laser medium used in a solid laser is a solid base doped with active species functioning as a laser. The solid base is crystal or glass. The crystal is YAG (yttrium aluminum garnet crystal), YLF, YVO$_4$, YAlO$_3$, sapphire, ruby, or alexandrite. In addition, the active species functioning as a laser are, for example, trivalent irons (such as Cr$^{3+}$, Nd$^{3+}$, Yb$^{3+}$, Tm$^{3+}$, Ho$^{3+}$, Er$^{3+}$, and Ti$^{3+}$).

As a laser used in the present invention, a continuous wave laser or a pulse oscillation laser can be used. The irradiation condition of a laser beam (for example, frequency, power density, energy density, beam profile, or the like) are appropriately controlled in consideration of a thickness of the substrate 11, the insulating layers 12, 14, and 15, and a material thereof.

As a laser used when the substrate 11 is the glass substrate, a solid laser having a wavelength of 1 nm or more to 380 nm or less, which is an ultraviolet region, is preferably used. More preferably, an Nd:YVO$_4$ laser having a wavelength of 1 nm or more to 380 nm or less, which is an ultraviolet region, is used. It is because light is more easily absorbed in a substrate (especially a glass substrate) by using a laser having a wavelength of an ultraviolet region compared with other laser at a longer wavelength side, and an ablation process is easily performed. Moreover, it is because an ablation process is easily performed especially by using an Nd:YVO$_4$ laser. Also, a laser beam having a wavelength in a range of 1 nm or more to 350 nm or less may be used in case of a plastic substrate (for example, a substrate comprising polyethylene terephthalate). In this case, preferably an Nd:YVO$_4$ laser is also used.

Note that a laser irradiation device for emitting the above laser beam has a moving table, a substrate, a head portion, and a control portion. The moving table is provided with an adsorption hole. The substrate is held by the adsorption hole over the moving table. The head portion emits a laser beam which is emitted from a laser oscillation device through a laser head. The control portion positions the laser head at a random place over the surface of the substrate by moving one or both of the moving table and the head portion, and accordingly, a laser beam is emitted. Note that the control portion recognizes and determines a portion to be processed from a relative position on the basis of a mark for positioning over a substrate which is taken by a CCD camera.

Figure 3A:
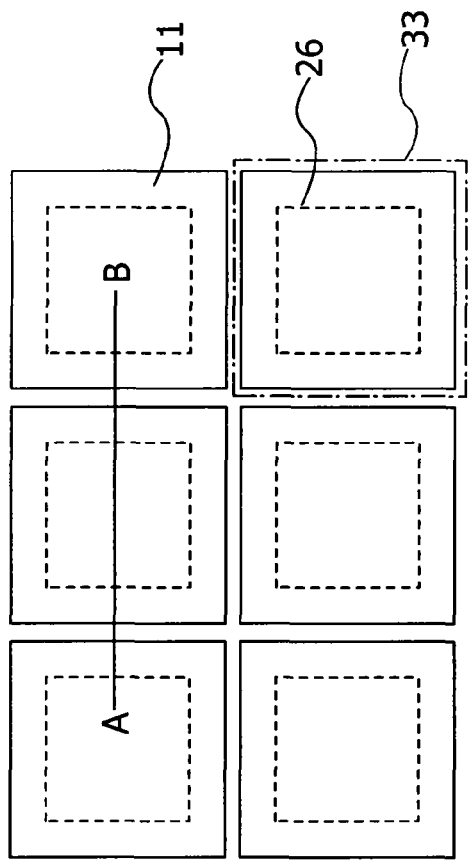
FIGS. 3A and 3B are views each explaining a semiconductor device of the present invention.
Figure 3B:
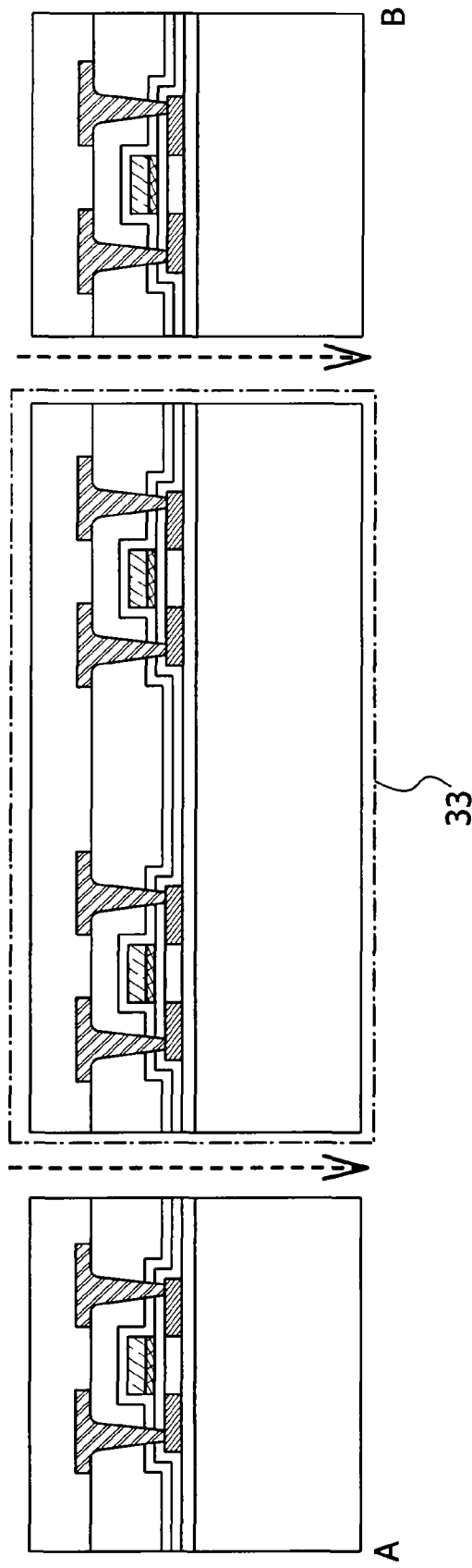

Next, a laser beam is selectively emitted to cut off the substrate 11, the insulating layers 12, 14, 15, 16, and 25 (see FIGS. 3A and 3B). Or, these may dynamically be cut with a formed groove. Through the above process, a laminated body 33 including the substrate 11 and the plurality of transistors 13 can be obtained.

Subsequently, the laminated body 33 including the substrate 11 and the plurality of transistors 13 is sealed using films 34 and 35 if necessary (see FIG. 4A). The films 34 and 35 are made of a material such as polyethylene, polycarbonate, polypropylene, polyester, vinyl, polyvinyl fluoride, vinyl chloride, ethylene vinyl acetate, urethane, or polyethylene terephthalate, or a fiber material (for example, paper). Each of the films may be a single layer or a stacked layer of a plurality of films. In addition, an adhesion layer may also be provided over the surface thereof. The adhesion layer corresponds to a layer containing an adhesive such as a polyester or polyolefin thermal flexible resin, a thermal curing resin, an ultraviolet curing resin, a vinyl acetate resin adhesive, a vinyl copolymer resin adhesive, an epoxy resin adhesive, a urethane resin adhesive, a rubber adhesive, or an acrylic resin adhesive.

Each surface of the films 34 and 35 may be coated with powder of silicon dioxide (silica). A waterproof property can be maintained even under a high temperature environment or a high humidity environment by coating. In other words, a function of humidity resistance can be obtained. In addition, the surface thereof may also be coated with a conductive material such as indium tin oxide. The material which is used for coating charges static electricity, and accordingly, the plurality of transistors 13 can be protected from static electricity. That is, a function of preventing static electricity can be obtained. Moreover, the surface thereof may also be coated with a material containing carbon as its main component (for example, diamond like carbon or carbon containing nitrogen). The strength is increased by coating, and accordingly, a semiconductor device can be prevented from deteriorating and being destroyed. In addition, the films 34 and 35 may also be formed from a material in which a material for a base material (such as a resin) and a material containing silicon oxide, a conductive material, or carbon as its main component are mixed. Moreover, the films 34 and 35 can obtain a function of preventing static electricity by applying a surface active agent over the surface, or alternatively, by directly adding the surface active agent into the films.

Each surface layer of the films 34 and 35 or each surface adhesion layer of the films 34 and 35 is melted by heat treatment, and accordingly, the plurality of transistors 13 are sealed with the films 34 and 35. In addition, adhesion is performed by pressure treatment.

According to one feature of the present invention, a laminated body including the substrate 11 and the plurality of transistors 13 is provided between the films 34 and 35. By the above feature, intrusion of harmful gas, water, or an impurity element can be suppressed. Therefore, deterioration or destruction of the plurality of transistors 13 is suppressed, and accordingly, the reliability can be improved.

Note that a conductive layer functioning as an antenna may be provided at one or both of the films 34 and 35. When the laminated body 33 including the plurality of transistors 13 is sealed with the films 34 and 35, the conductive layer over the films 34 and 35 and the plurality of transistors 13 may be electrically connected to each other. At this time, it is preferable to provide an exposed conductive layer for connection in the laminated body including the plurality of transistors 13. Then, sealing is performed so that the conductive layer for connection and the conductive layer over the films 34 and 35 are in contact with each other. Accordingly, a semiconductor device capable of transmitting and receiving electromagnetic waves can be provided.

Note that the substrate 11 may be thinned by performing one or both of grinding and polishing to the other surface of the substrate 11 by using one or both of a grinding device (for example, a grinding machine) and a polishing device (for example, a grinding stone). Thereafter, a laser beam is selectively emitted to cut off the insulating layers 12, 14, 15, and 16, and the thinned substrate 11. Subsequently, the laminated body 33 including the substrate 11 and the plurality of transistors 13 is sealed by using the films 34 and 35 (see FIG. 4B). Note that one or both of grinding and polishing may be performed to the substrate 11 so that the thickness of the substrate 11 is 100 μm, preferably 50 μm or less, and more preferably 5 μm or less.

Note that when one or both of grinding and polishing is/are performed, a film aimed at protection may be provided over the insulating layer 25 to be fixed, and thereafter, one or both of grinding and polishing is/are performed to the other surface of the substrate 11. Note that the film which is provided over the insulating layer 25 may be a film having a surface provided with an UV curing adhesive. In addition, after one or both of grinding and polishing is/are performed, the film provided over the insulating layer 25 may be left or removed.

As described above, by thinning the substrate 11, the insulating layers 12, 14, 15, and 16, and the substrate 11 can be easily cut off at short times using a laser beam. In addition, by thinning the substrate, a semiconductor device having flexibility can be provided. By making a semiconductor device have flexibility, design can be improved, and the semiconductor device can be easily mounted on an object with a flexible shape; accordingly, the semiconductor device can be utilized in various fields.

In addition, although a shape of the cut substrate 11 is a simple square shape in the above process, the present invention is not limited thereto. For example, a hexagonal groove 32 may be formed in the laminated body including the substrate 11 by scanning and emitting a laser beam (see FIG. 5A), and subsequently, the laser beam is emitted to cut off the laminated body including the substrate 11 (see FIG. 5B). Accordingly, a hexagonal laminated body including the substrate 11 can be formed. Moreover, a circular groove 32 may be formed in the laminated body including the substrate 11 by emitting a laser beam (see FIG. 5C), and the laser beam may be emitted to cut off the laminated body including the substrate 11 (see FIG. 5D). Accordingly, a circular laminated body including the substrate 11 can be formed.

An interior angle of the top shape of the laminated body including the substrate 11 is set to be 90 degrees or more (for example, a polygonal shape such as hexagon), or eliminating corner of the laminated body including the substrate 11 (for example, a circular shape or an ellipse shape) by devising the shape as described above; accordingly, the semiconductor device can be easily treated in carrying. In addition, generation of a defect, a crack or a burr at the time of mounting on a product can be prevented.

Embodiment 1

Figure 6C:
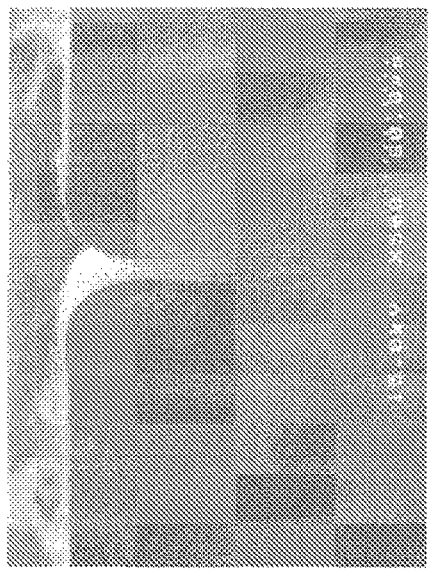
FIGS. 6A to 6D are photographs (SEM images) each showing a cutting surface of a glass substrate.
Figure 6D:
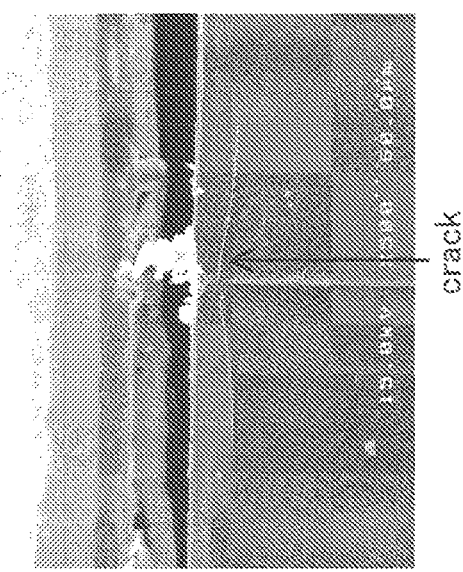

Results of an experiment using the present invention will be explained with reference to FIGS. 6A to 6D. Each of FIGS. 6A to 6C shows a cutting surface of a glass substrate.

As a first experiment, it was attempted to selectively emit a laser beam to a glass substrate, form a groove in the glass substrate, and cut off the glass substrate dynamically. Note that the size of the glass substrate which was used was 126.6 mm×126.6 mm×thickness of 0.7 mm. An Nd:YVO$_4$ laser having a wavelength of 266 nm was used for a laser. The irradiation condition of the laser beam was as follows: output power of 2.0 W, frequency of 15 kHz, and feeding speed of 20 mm/sec.

Figure 6A:
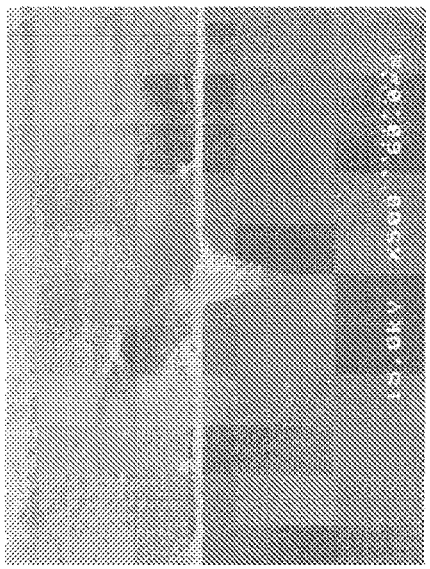
Figure 6B:
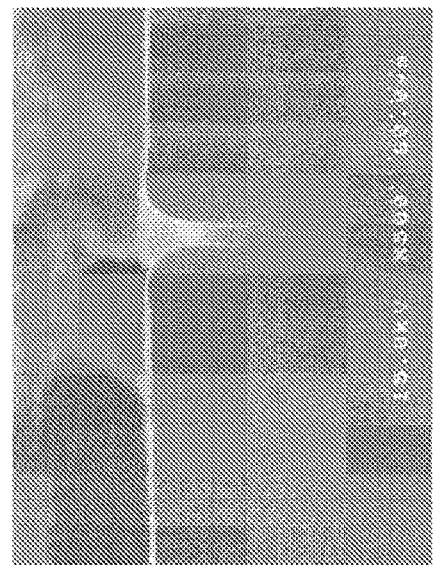

As a result of selectively emitting a laser beam to the glass substrate, a V-shaped groove was formed in the glass substrate (see FIG. 6A). Then, as a result of emitting a laser beam to the glass substrate again, a deeper groove was formed in a depth direction (see FIG. 6B). Next, the feeding speed of 20 mm/sec was changed to 5 mm/sec, and a laser beam is emitted to the glass substrate again; accordingly, a deeper groove was formed in the depth direction (see FIG. 6C). Subsequently, when it was attempted to dynamically cut off the glass substrate where the above groove was formed, the glass substrate could be easily cut off. In this case, the position of the groove to which the laser beam was emitted became the cutting surface.

As a second experiment, it was attempted to cut off the glass substrate only by selectively emitting a laser beam to the glass substrate. The laser beam was emitted 6 times. Note that the size of the glass substrate which was used was 126.6 mm×126.6 mm×thickness of 0.7 mm. An Nd:YVO$_4$ laser having a wavelength of 266 nm was used for a laser. The irradiation condition of the laser was as follows: output power of 2.0 W, frequency of 15 kHz, and feeding speed of 5 mm/sec. As a result of the experiment, the glass substrate could be easily cut off without generating a crack and the like.

As a third experiment, the glass substrate was polished to be 100 μm thick or less by using a polishing device. Then, it was attempted to cut off the glass substrate only by selectively emitting a laser beam to the glass substrate which was polished. Note that the size of the glass substrate which was used was 126.6 mm×126.6 mm×thickness of 0.7 mm. An Nd:YVO$_4$ laser having a wavelength of 266 nm was used for a laser. The irradiation condition of the laser was as follows: output power of 2.0 W, frequency of 15 kHz, and feeding speed of 30 mm/sec. As a result of the experiment, the glass substrate could be easily cut off without generating a crack and the like.

According to these results, it is found that it is necessary to control a thickness of a glass substrate and to appropriately adjust irradiation condition of a laser such as output power, feeding speed, and the number of irradiation in a case of emitting a laser beam to a glass substrate to form a groove in the glass substrate, and also, in a case of emitting a laser beam to a glass substrate to cut off the glass substrate.

In addition, when a laser beam is emitted to a glass substrate to form a groove in the glass substrate, a cutting surface of the groove is rounded (see FIGS. 6B and 6C). In a case where the cutting surface is rounded as described above, a defect of a corner of the cutting surface or a crack can be prevented from being generated as compared with a case where there is a corner at a cutting surface. According to such an advantage, a glass substrate can be easily handled mainly when the glass substrate is carried using a robot or the like. Moreover, also in being mounted on a product, generation of a defect or a crack can be suppressed, and generation of a damage or destruction of a substrate can be suppressed.

Embodiment 2

Figure 7:
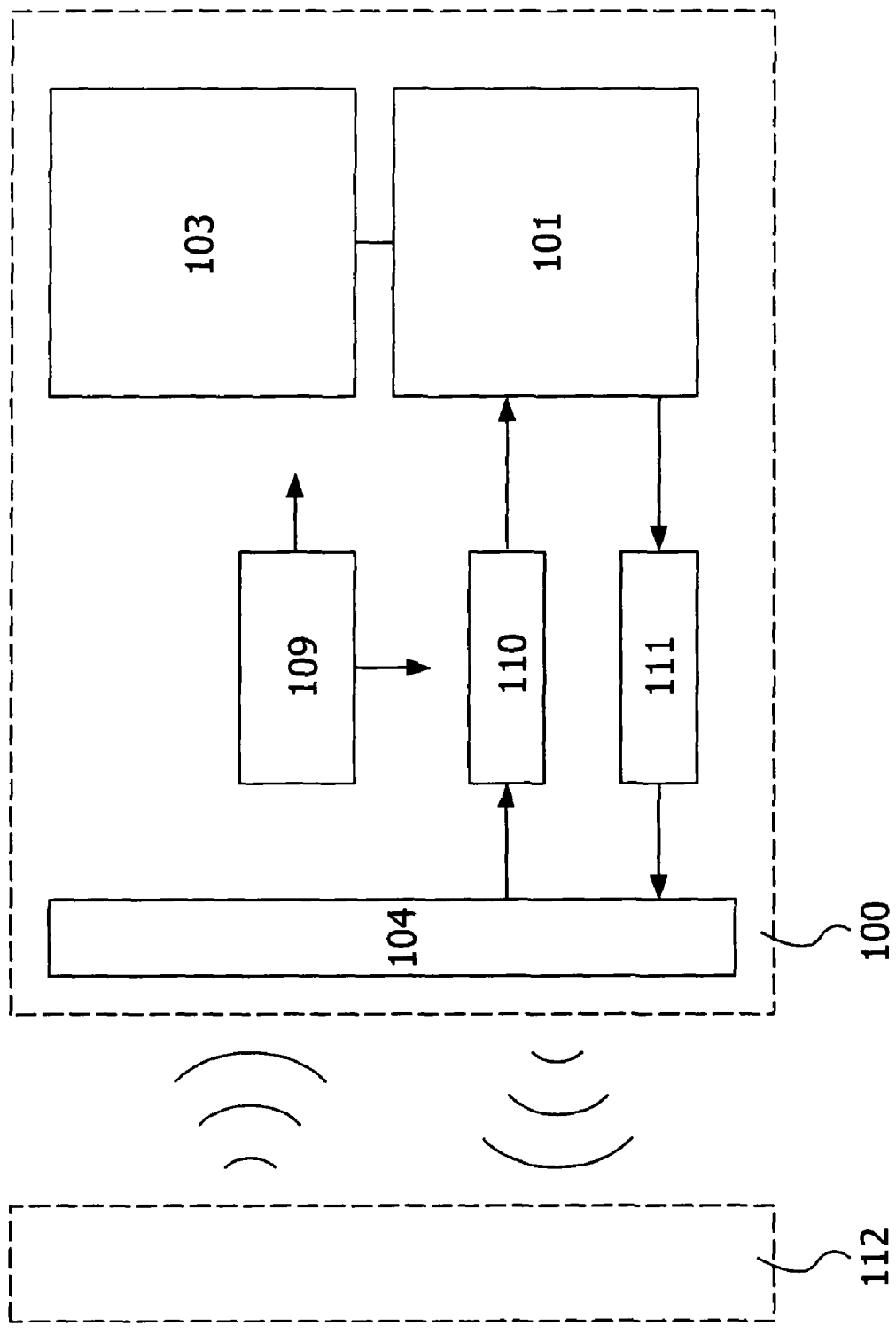
FIG. 7 is a view explaining a semiconductor device of the present invention.

A structure of a semiconductor device of the present invention will be explained with reference to FIG. 7. A semiconductor device 100 of the present invention has an arithmetic processing circuit 101, a memory circuit 103, an antenna 104, a power source circuit 109, a demodulation circuit 110, and a modulation circuit 111. The antenna 104 and the power source circuit 109 are essential component parts of the semiconductor device 100, and the other parts are appropriately provided in accordance with an application of the semiconductor device 100.

The arithmetic processing circuit 101 analyzes an order, controls the memory circuit 103, and outputs data which is transmitted to an exterior portion to the modulation circuit 111 on the basis of a signal which is inputted from the demodulation circuit 110.

The memory circuit 103 has a circuit including a memory element and a control circuit which writes and reads data. At least an identification number of the semiconductor device itself is stored in the memory circuit 103. The identification number is used to distinguish from other semiconductor devices. In addition, the memory circuit 103 has one or more kinds selected from an organic memory, a DRAM (Dynamic Random Access Memory), a SRAM (Static Random Access Memory), an FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), and a flash memory. The organic memory has a structure in which a layer containing an organic compound is interposed between a pair of electrodes, and the structure is simple; therefore, the organic memory has at least two advantages. One advantage is that a manufacturing process can be simplified and cost can be reduced. The other advantage is that an area of a laminated body can be easily reduced and an organic memory with high capacity can be easily realized. Moreover, since an organic memory is a nonvolatile memory, a battery may be incorporated or may not necessarily be incorporated. Therefore, it is preferable to use an organic memory as the memory circuit 103.

The antenna 104 converts a carrier wave which is supplied from a reader/writer 112 into an AC electrical signal. Also, load modulation is added by the modulation circuit 111. The power source circuit 109 generates a power source voltage by using the AC electrical signal which is converted by the antenna 104 to provide a power source voltage for each circuit.

The demodulation circuit 110 demodulates the AC electrical signal which is converted by the antenna 104 and supplies the demodulated signal to the arithmetic processing circuit 101. The modulation circuit 111 adds load modulation to the antenna 104 on the basis of a signal which is supplied from the arithmetic processing circuit 101.

The reader/writer 112 receives the load modulation which is added to the antenna 104 as a carrier wave. Also, the reader/writer 112 transmits the carrier wave to the semiconductor device 100. Note that the carrier wave is an electromagnetic wave transmitted and received by the reader/writer 112, and the reader/writer 112 receives a carrier wave which is modulated by the modulation circuit 111.

As described above, the semiconductor device of the present invention having a function to transmit and receive an electromagnetic wave wirelessly is referred to as an RFID (Radio Frequency Identification), an RF chip, an RF tag, an IC tag, an IC label, a wireless chip, a wireless tag, an electronic chip, an electronic tag, a wireless processor, or a wireless memory. This embodiment can be freely combined with other embodiment modes.

Embodiment 3

Figure 8E:
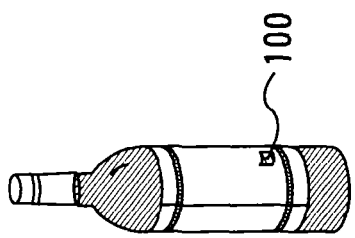
FIGS. 8A to 8F are views each explaining a semiconductor device of the present invention.
Figure 8F:
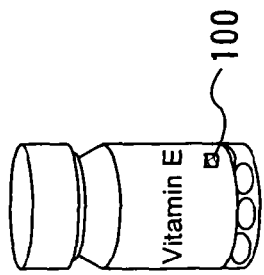
Figure 8C:
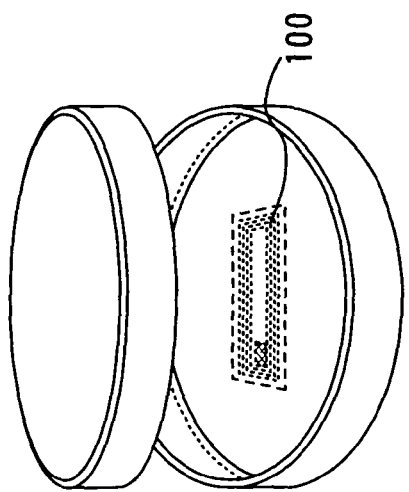
Figure 8D:
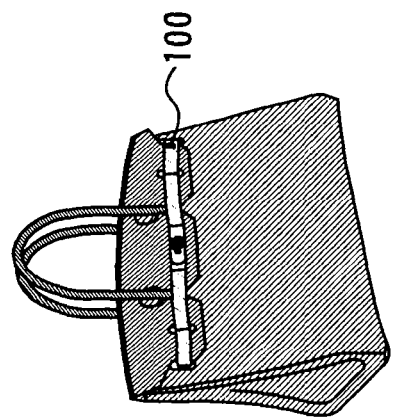
Figure 8A:
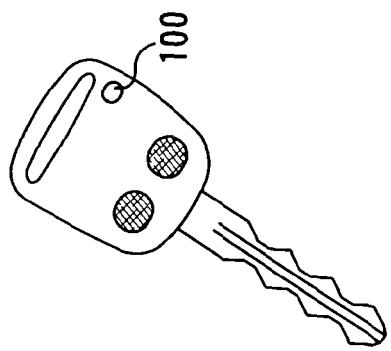
Figure 8B:
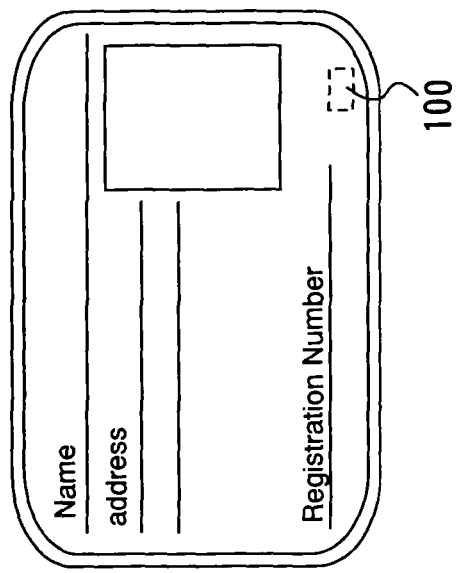

The semiconductor device 100 to which the present invention is applied can be used for various goods and various systems by utilizing a function to transmit and receive an electromagnetic wave. The goods are, for example, keys (see FIG. 8A), bills, coins, securities, bearer bonds, certificates (such as a driver's license and a residence certificate; see FIG. 8B), documents, containers (such as a petri dish; see FIG. 8C), packing containers (such as wrapping paper and a bottle; see FIGS. 8E and 8F), a recording medium (such as a disk and a video tape), vehicles (such as a bicycle), accessories (such as a bag and glasses; see FIG. 8D), foods, clothes, livingwares, electronic devices (such as a liquid crystal display device, an EL display device, a television device, and a portable terminal), and the like. The semiconductor device of the present invention is attached or mounted on surfaces of the above described goods having various shapes to be fixed. Also, a system indicates a goods management system, an authentication function system, a distribution system, or the like, and high functionality, multi functionality, and high added value of the system can be attempted. This embodiment can be freely combined with other embodiment modes and embodiments.

Embodiment 4

In this embodiment, a method for manufacturing a transistor will be explained with reference to FIGS. 9A to 9D, FIGS. 10A to 10C, and FIGS. 11A and 11B.

Figure 9A:
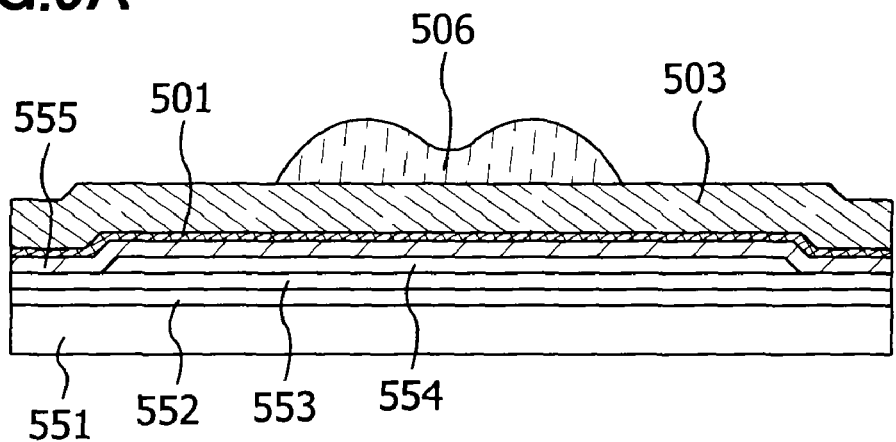
FIGS. 9A to 9D are views each explaining a semiconductor device of the present invention.

First, an insulating layer 552 is formed over a substrate 551 (see FIG. 9A). Then, an insulating layer 553 is formed over the insulating layer 552. Next, a semiconductor layer 554 is formed over the insulating layer 553. Subsequently, a gate insulating layer 555 is formed over the semiconductor layer 554.

The insulating layers 552 and 553, the semiconductor layer 554, the gate insulating layer 555, and the like may be formed by using plasma treatment. It is preferable that plasma treatment herein used is performed with electron density of $1 \times 10^{11}$ cm$^{-3}$ or more and electron temperature of plasma of 1.5 eV or less. More specifically, it is preferable that the plasma treatment is performed with electron density of $1 \times 10^{11}$ cm$^{-3}$ or more and $1 \times 10^{13}$ cm$^{-3}$ or less and an electron temperature of plasma of 0.5 eV or more and 1.5 eV or less.

When the electron density of plasma is high and the electron temperature near a substance to be processed (for example, the insulating layers 552 and 553, the semiconductor layer 554, the gate insulating layer 555, or the like) is low, a damage due to plasma to the substance to be processed can be prevented. Also, since electron density of plasma is $1 \times 10^{11}$ cm$^{-3}$ or more, which is high, oxide or nitride which is formed by oxidizing or nitriding a substance to be irradiated by using plasma treatment can be formed as a film which is excellent in uniformity of thickness or the like and is also fine, compared with a thin film which is formed by a CVD method, a sputtering method, or the like. Moreover, since electron temperature of plasma is 1.5 eV or less, which is low, the oxidizing or nitriding treatment can be performed at lower temperature compared with conventional plasma treatment or thermal oxidation method. For example, the oxidizing or nitriding treatment can be sufficiently performed even when the plasma treatment is performed at lower temperature by at least 100° C. than a strain point of a glass substrate.

Subsequently, a conductive layer 501 and a conductive layer 503 are stacked over the gate insulating layer 555. Each of the conductive layer 501 and the conductive layer 503 is formed by using metal such as tungsten, chromium, tantalum, tantalum nitride, molybdenum, alloy or a compound containing the above metal as its main component. Note that the conductive layer 501 and the conductive layer 503 are formed by using different materials from each other. Specifically, in an etching process which is performed afterward, a material which generates difference in etching rate is used.

Next, a mask 506 made of a resist is formed over the conductive layer 503. The mask 506 is formed by using an exposure mask including a light-shielding film and a translucent film. A specific structure of the mask will be explained hereinafter.

Figure 9B:
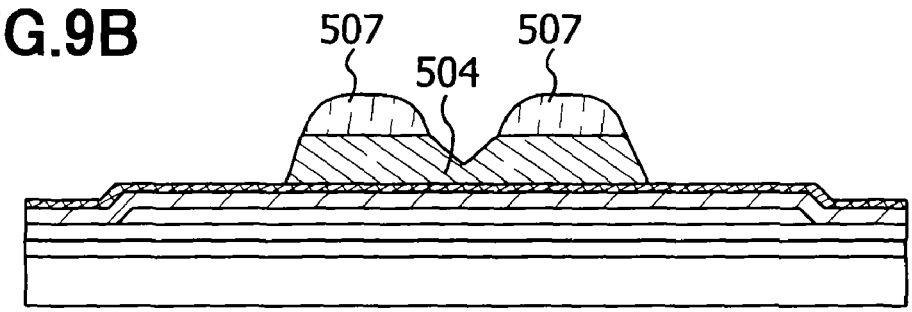
Figure 9C:
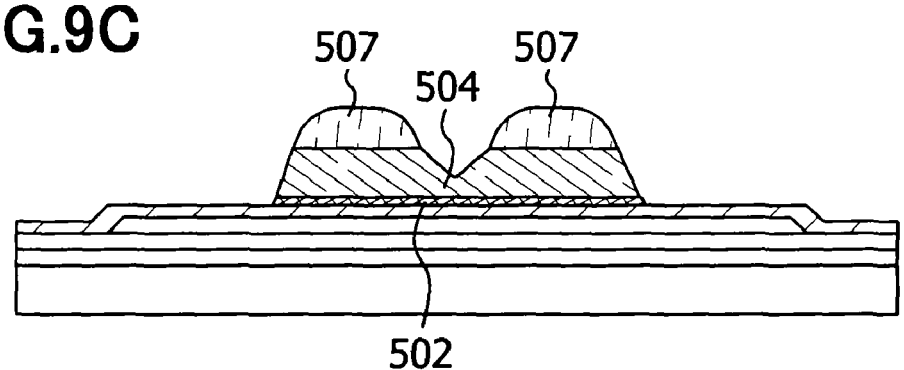

Then, the conductive layer 503 is etched using the mask 506 to form a mask 507 and a conductive layer 504 (see FIG. 9B). The mask 507 is sputtered by ion which is accelerated in an electric field, divided into two patterns, and placed separately. Next, the conductive layer 501 is etched using the mask 507 and the conductive layer 504 to form a conductive layer 502 (see FIG. 9C).

Figure 9D:
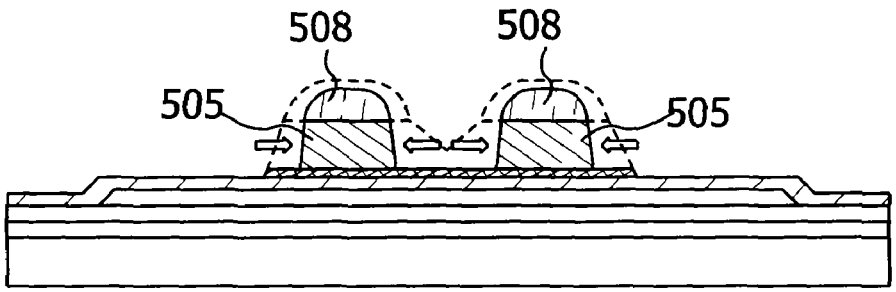

Subsequently, the mask 507 and the conductive layer 504 are selectively etched to form a mask 508 and a conductive layer 505 (see FIG. 9D). The mask 508 is sputtered by ion which is accelerated in an electric field and the size is reduced. In this process, a bias voltage which is applied to the substrate side is adjusted so that the conductive layer 502 is prevented from being etched.

Figure 10A:
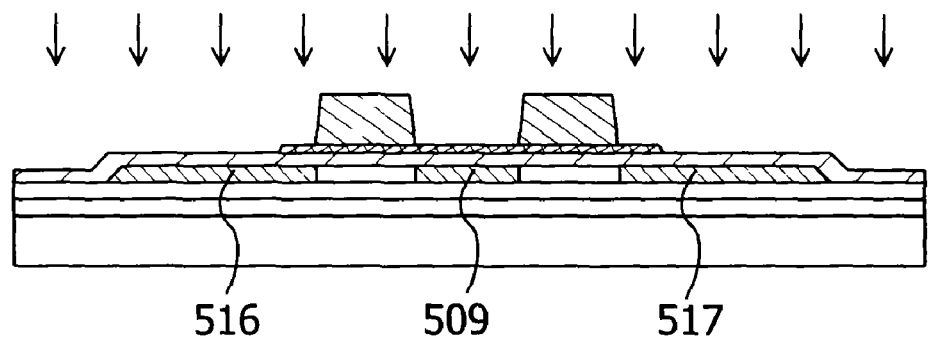
FIGS. 10A to 10C are views each explaining a semiconductor device of the present invention.

Then, an impurity element imparting one conductivity type is added to the semiconductor layer 554 to form first concentration impurity regions 509, 516, and 517 (see FIG. 10A). At this time, an impurity element is added to the semiconductor layer 554 in a self-aligned manner by using the conductive layers 502 and 505.

Figure 10B:
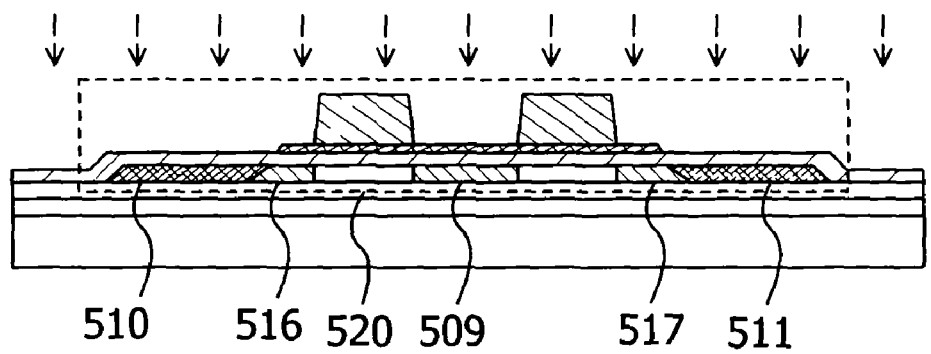

Next, an impurity element imparting one conductivity type is added to the semiconductor layer 554 to form second concentration impurity regions 510 and 511 (see FIG. 10B). The second concentration is made to be higher than the first concentration. Note that an impurity element imparting one conductivity type is not added to the semiconductor layer 554 which is overlapped with the conductive layer 505. Therefore, the semiconductor layer 554 which is overlapped with the conductive layer 505 functions as a channel formation region. Through the above process, a thin film transistor 520 is completed.

Figure 10C:
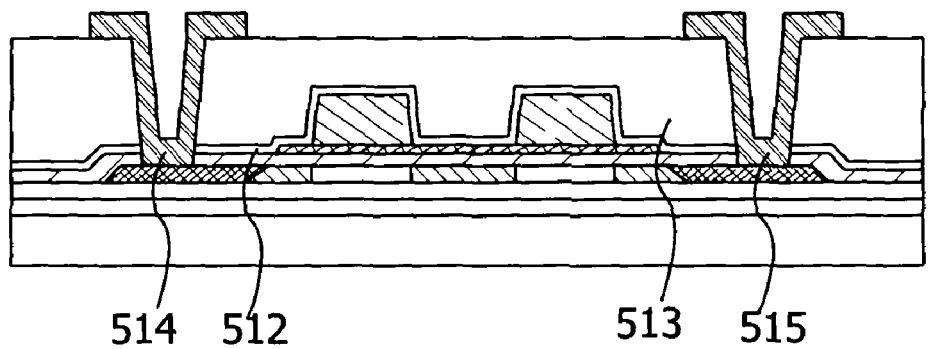

Next, insulating layers 512 and 513 are formed so as to cover the thin film transistor 520 (see FIG. 10C). Then, conductive layers 514 and 515 connected to the second concentration impurity regions 510 and 511 are formed through openings provided in the insulating layers 512 and 513.

According to one feature of the above process, the conductive layers 501 and 503 are etched using the mask 506 having a different thickness and a complicated shape. The masks 507 that are placed separately can be formed by using the mask 506. Then, a distance between two channel formation regions can be shortened. Specifically, the distance between two channel formation regions can be set to be less than 2 μm. Therefore, in a case of forming a multigate thin film transistor having two or more of gate electrodes, the occupation area thereof can be reduced. Therefore, high integration can be realized and a high definition semiconductor device can be provided.

Figure 11A:
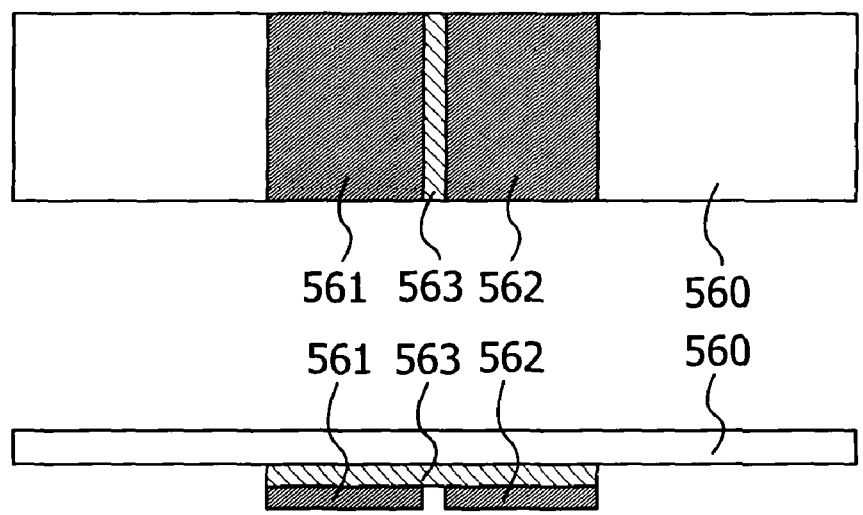
FIGS. 11A and 11B are views each explaining a semiconductor device of the present invention.
Figure 11B:
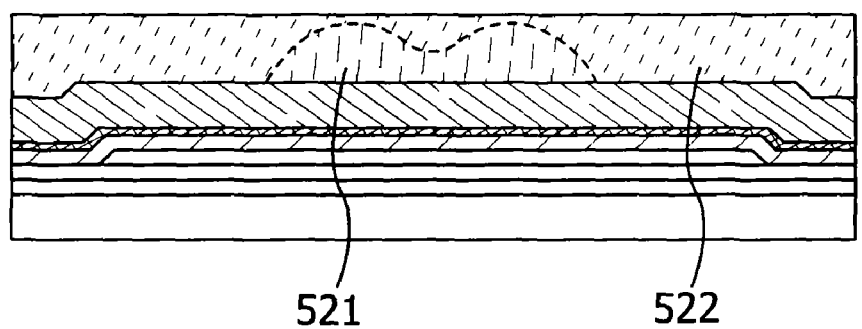

Next, a method for forming the mask 506 will be explained with reference to FIGS. 11A and 11B. FIG. 11A is a plan view in which part of an exposure mask is enlarged. Also, FIG. 11B is a cross-sectional view of part of the exposure mask corresponding to FIG. 11A and a cross-sectional view of the laminated body including the substrate 551.

The exposure mask has a light-transmitting substrate 560, light-shielding films 561 and 562, and a translucent film 563. The light-shielding films 561 and 562 are made of a metal film such as chromium, tantalum, or CrNx (x is a positive integer). It is necessary that a material for the translucent film 563 is appropriately selected with respect to an exposure wavelength, and for example, TaSixOy (x and y are positive integers), CrOxNy (x and y are positive integers), CrFxOy (x and y are positive integers), MoSixNy (x and y are positive integers), and MoSixOy (x and y are positive integers) may be used. The translucent film 563 functions as an assist pattern.

When a resist mask is exposed by using the exposure mask having the above structure, the resist mask is classified broadly into a region which is not exposed 521 and a region which is exposed 522. When a development process is performed in this state, the resist of the region which is exposed 522 is removed, and part of the resist of a portion corresponding to the translucent film 563 in the exposure mask in the region which is not exposed 521 is removed. A mask having a shape as shown in FIG. 9A is formed.

This application is based on Japanese Patent Application serial No. 2005-156583 filed in Japan Patent Office on May 30 in 2005, the entire contents of which are hereby incorporated by reference.

What is claimed is:
1. A method for manufacturing a semiconductor device comprising:
   forming a layer comprising a transistor over a substrate;
   forming a first insulating layer over the layer comprising the transistor;
   forming an opening in the first insulating layer;

forming a conductive layer which is connected to one of a source region and a drain region of the transistor through the opening;
forming a second insulating layer to cover the conductive layer;
emitting a first laser beam selectively with an ablation process to cut off the first insulating layer, an insulating layer which is provided in the layer comprising the transistor, and the second insulating layer, and to form a groove in the substrate;
cutting off the first insulating layer, the insulating layer which is provided in the layer including the transistor, the second insulating layer, and the substrate by directing a second laser beam into the groove; and
sealing a laminated body including the substrate, the layer comprising the transistor, the first insulating layer, the conductive layer, and the second insulating layer using first and second films to sandwich the laminated body by melting each surface layer of the first and second films by heat treatment after the cutting off step.

2. The method for manufacturing the semiconductor device according to claim 1, wherein at least one of the first laser beam and the second laser beam is oscillated from an Nd:YVO$_4$ laser.

3. The method for manufacturing the semiconductor device claim 1, wherein a wavelength of at least one of the first laser beam and the second laser beam is in a range of 1 nm or more to 380 nm or less.

4. The method for manufacturing the semiconductor device according to claim 1, wherein a corner of a cutting surface of the substrate is rounded in an upper portion of a cross section.

5. The method for manufacturing the semiconductor device according to claim 1, wherein the substrate is glass.

6. A method for manufacturing a semiconductor device comprising:
forming a layer including a transistor over one of surfaces of a substrate;
forming a first insulating layer over the layer comprising the transistor;
forming an opening in the first insulating layer;
forming a conductive layer which is connected to one of a source region and a drain region of the transistor through the opening;
forming a second insulating layer to cover the conductive layer;
polishing the other surface of the substrate;
emitting a first laser beam selectively with an ablation process to cut off the first insulating layer, an insulating layer which is provided in the layer comprising the transistor, and the second insulating layer, and to form a groove in the substrate;
cutting off the first insulating layer, the insulating layer which is provided in the layer including the transistor, the second insulating layer, and the substrate by directing a second laser beam into the groove; and
sealing a laminated body including the substrate, the layer comprising the transistor, the first insulating layer, the conductive layer, and the second insulating layer using first and second films to sandwich the laminated body by melting each surface layer of the first and second films by heat treatment after the cutting off step.

7. The method for manufacturing the semiconductor device according to claim 6, wherein at least one of the first laser beam and the second laser beam is oscillated from an Nd:YVO$_4$ laser.

8. The method for manufacturing the semiconductor device claim 6, wherein a wavelength of at least one of the first laser beam and the second laser beam is in a range of 1 nm or more to 380 nm or less.

9. The method for manufacturing the semiconductor device according to claim 6, wherein a corner of a cutting surface of the substrate is rounded in an upper portion of a cross section.

10. The method for manufacturing the semiconductor device according to claim 6, wherein the substrate is glass.

11. The method for manufacturing the semiconductor device according to claim 1, wherein the method further comprised a step of forming a second conductive layer functioning as an antenna over the substrate.

12. The method for manufacturing the semiconductor device according to claim 6, wherein the method further comprised a step of forming a second conductive layer functioning as an antenna over the substrate.

13. The method for manufacturing the semiconductor device according to claim 1, wherein the method further comprises a step of providing a second conductive layer functioning as an antenna electrically connected to the transistor over at least one of the first and a second films.

14. The method for manufacturing the semiconductor device according to claim 6, wherein the method further comprises a step of providing a second conductive layer functioning as an antenna electrically connected to the transistor over at least one of the first and a second films.

15. The method for manufacturing the semiconductor device according to claim 1, wherein a cutting surface of the groove is rounded in an upper portion of a cross section.

16. The method for manufacturing the semiconductor device according to claim 6, wherein a cutting surface of the groove is rounded in an upper portion of a cross section.

17. A method for manufacturing a semiconductor device comprising:
forming a layer comprising a transistor over a substrate;
forming a first insulating layer over the layer comprising the transistor;
forming an opening in the first insulating layer;
forming a conductive layer which is connected to one of a source region and a drain region of the transistor through the opening;
forming a second insulating layer to cover the conductive layer; and
emitting a first laser beam selectively with an ablation process to cut off the first insulating layer, an insulating layer which is provided in the layer comprising the transistor, and the second insulating layer, and to form a groove in the substrate;
cutting off the first insulating layer, the insulating layer which is provided in the layer including the transistor, the second insulating layer, and the substrate by directing a second laser beam into the groove; and
sealing a laminated body including the substrate, the layer comprising the transistor, the first insulating layer, the conductive layer, and the second insulating layer using first and second films to sandwich the laminated body by melting each surface adhesion layer of the first and second films by heat treatment after the cutting off step.

18. The method for manufacturing the semiconductor device according to claim 17, wherein at least one of the first laser beam and the second laser beam is oscillated from an Nd:YVO$_4$ laser.

19. The method for manufacturing the semiconductor device claim 17, wherein a wavelength of at least one of the first laser beam and the second laser beam is in a range of 1 nm or more to 380 nm or less.

20. The method for manufacturing the semiconductor device according to claim 17, wherein a corner of a cutting surface of the substrate is rounded in an upper portion of a cross section.

21. The method for manufacturing the semiconductor device according to claim 17, wherein the substrate is glass.

22. The method for manufacturing the semiconductor device according to claim 17, wherein the method further comprised a step of forming a second conductive layer functioning as an antenna over the substrate.

23. The method for manufacturing the semiconductor device according to claim 17, wherein the method further comprises a step of providing a second conductive layer functioning as an antenna electrically connected to the transistor at least one of at the first and a second films.

24. The method for manufacturing the semiconductor device according to claim 17, wherein a cutting surface of the groove is rounded in an upper portion of a cross section.

25. A method for manufacturing a semiconductor device comprising:
    forming a layer including a transistor over one of surfaces of a substrate;
    forming a first insulating layer over the layer comprising the transistor;
    forming an opening in the first insulating layer;
    forming a conductive layer which is connected to one of a source region and a drain region of the transistor through the opening;
    forming a second insulating layer to cover the conductive layer;
    polishing the other surface of the substrate;
    emitting a first laser beam selectively with an ablation process to cut off the first insulating layer, an insulating layer which is provided in the layer comprising the transistor, and the second insulating layer, and to form a groove in the substrate;
    cutting off the first insulating layer, the insulating layer which is provided in the layer including the transistor, the second insulating layer, and the substrate by directing a second laser beam into the groove; and
    sealing a laminated body including the substrate, the layer comprising the transistor, the first insulating layer, the conductive layer, and the second insulating layer using first and second films to sandwich the laminated body by melting each surface adhesion layer of the first and second films by heat treatment after the cutting off step.

26. The method for manufacturing the semiconductor device according to claim 25, wherein at least one of the first laser beam and the second laser beam is oscillated from an $Nd:YVO_4$ laser.

27. The method for manufacturing the semiconductor device claim 25, wherein a wavelength of at least one of the first laser beam and the second laser beam is in a range of 1 nm or more to 380 nm or less.

28. The method for manufacturing the semiconductor device according to claim 25, wherein a corner of a cutting surface of the substrate is rounded in an upper portion of a cross section.

29. The method for manufacturing the semiconductor device according to claim 25, wherein the substrate is glass.

30. The method for manufacturing the semiconductor device according to claim 25, wherein the method further comprised a step of forming a second conductive layer functioning as an antenna over the substrate.

31. The method for manufacturing the semiconductor device according to claim 25, wherein the method further comprises a step of providing a second conductive layer functioning as an antenna electrically connected to the transistor over at least one of the first and a second films.

32. The method for manufacturing the semiconductor device according to claim 25, wherein a cutting surface of the groove is rounded in an upper portion of a cross section.

* * * * *